United States Patent [19]

Galvin et al.

[11] 3,778,686

[45] Dec. 11, 1973

[54] CARRIER FOR BEAM LEAD INTEGRATED CIRCUITS

[75] Inventors: Lee Robert Galvin, Lafayette; Arthur J. Kline, Jr., Scottsdale, both of Ariz.

[73] Assignee: Motorola, Inc., Franklin Park, Ill.

[22] Filed: Aug. 18, 1972

[21] Appl. No.: 281,641

[52] U.S. Cl. ............ 317/234 R, 317/234 G, 174/52

[51] Int. Cl. ............ H01l 5/00

[58] Field of Search ............ 317/234

[56] References Cited

UNITED STATES PATENTS

| | | | |
|---|---|---|---|
| 3,676,569 | 7/1972 | Thompson | 174/52 S |
| 3,617,819 | 11/1971 | Boisvert et al. | 317/234 |
| 3,697,666 | 10/1972 | Wakley et al | 174/52 |
| 3,665,592 | 5/1972 | Apospors | 29/588 |
| 3,586,926 | 6/1971 | Nakamura et al. | 317/234 |

*Primary Examiner*—John W. Huckert
*Assistant Examiner*—E. Wojciechowicz
*Attorney*—Foorman L. Mueller et al.

[57] ABSTRACT

A carrier for beam lead integrated circuits is disclosed wherein a pair of optically-clear, electrically-insulating base and cover members are disposed with major surfaces facing each other. A depression in the base member is adapted to accurately position the integrated circuit with its beam leads facing toward the depression. A fan-out circuit comprising a self-supporting film having metallic film circuits thereon is disposed between the major surfaces of the base and cover members with the inner terminals of the film circuits engaging the back surfaces of the beam leads. A hole in the fan-out circuit receives the body of the beam lead integrated circuit.

The outer terminals of the metallic film circuits extend beyond the edges of the base and cover members and are available for contacting during subsequent testing. A recess in the major surface of the cover member holds a soft rubber pressure member which urges the inner terminals of the metallic film circuits against the back surfaces of the beam leads. Frictional engagement between studs on the base member and holes on the cover member hold these two members, the fan-out circuit, and a beam lead integrated circuit in the depression assembled for carrying and testing.

15 Claims, 6 Drawing Figures

CARRIER FOR BEAM LEAD INTEGRATED CIRCUITS

BACKGROUND OF THE INVENTION

This invention relates to carriers for semiconductor circuits such as integrated circuits which have relatively rigid leads extending from the side of the integrated circuit and it is an object of the invention to provide improved carriers of this nature.

It is a further object of the invention to provide an improved carrier for integrated circuits of the nature indicated wherein the integrated circuit, while mounted in the carrier, may be visually inspected, and non-destructively tested.

It is a further object of the invention to provide an improved carrier for integrated circuits of the nature indicated which is simple in form, easy to use and inexpensive to produce.

Integrated circuits of the nature here involved are commonly referred to as beam lead integrated circuits. By this is meant that the conductors, leads, or terminals extending from the elements of the integrated circuit, which may be on a chip of semiconductor material, are relatively massive both in width and thickness as well as extending laterally beyond the sides of the chip and its supporting substrate. The leads are bonded to the elements of the integrated circuit and are sufficiently massive to be able to suport the integrated circuit and its substrate. The leads are truly cantilever beams in this sense. While the invention has particular application to beam lead integrated circuits of the nature indicated, other integrated circuits in which the leads extending therefrom are relatively rigid so as to be able to support the integrated circuit are within the scope of the invention whether, strictly speaking, the art refers to them as beam lead circuits, or not.

Beam lead integrated circuits are by nature very snall devices, being less than a tenth of an inch square in typical cases and are still relatively delicate. They are likewise intricate and relatively expensive. In many instances, such circuits are made a few at a time at one location for custom installations at another location. Consequently, carriers for such beam lead integrated circuits are needed for transporting them without damage. Before such installation it is desired, and may be essential, to test the integrated circuit to be certain that it is completely functional in all aspects. Removing it from the carrier and testing it presents a relatively difficult problem because it is necessary to attach some type of conductors to the beam leads.

In the prior art such testing has been destructive in part, in that the conductors had to be soldered, or welded, to the beam leads and then removed after the testing operation was finished. Such testing frequently involved destruction of the integrated circuit. In other prior art each carrier was adapted for testing only one circuit, and was of limited application.

According to the invention the carrier for the beam lead integrated circuits provides for complete visual inspection while in the carrier, and a removable fan-out circuit member provides pressure contact with the beam leads without soldering or welding. Hence the integrated circuit may be tested non-destructively without removing it from the carrier and this may be done after a visual inspection has determined that visually the circuit is complete in all respects. Furthermore, the test contacts, or leads, on the carrier are made to the rear side of the beam leads so that the front side to which leads ultimately are soldered, or welded, or bonded in any other way are not contaminated in any way at any time while in the carrier.

SUMMARY OF THE INVENTION

In carrying out the invention in one form, there is provided a carrier for a semiconductor circuit having a body portion and relatively rigid electrical leads extending therefrom at predetermined locations comprising: a transparent, electrically insulating base member having a major surface; said base member including a central depression in said major surface thereof, said depression having dimensions to accurately accommodate such semiconductor circuit and such electrical leads extending therefrom and said leads being adapted to have predetermined positions relative to the edges of said depression; guiding and holding members extending upwardly from said major surface; a transparent electrically insulating cover member having a major surface for disposition in face to face relationship with the major surface of said base member; said cover member including a central recess extending inwardly from said major surface of said cover member; holes in said cover member adapted to be disposed over said guiding and holding means and when so disposed, said central recess registers with said central depression; a self-supporting, electrically-insulating thin film having metallic film circuits disposed thereon for disposition between said major surfaces of said base and said cover members; said self-supporting film having openings therein to be disposed over said guiding and holding members when said film is disposed between said base and said cover member for holding said metallic film circuits in predetermined locations; a central opening in said self-supporting film adapted to register with said depression when the openings of said film are disposed over said guiding and holding means; said metallic film circuits terminating at the edges of said central opening in said self-supporting film and being disposed toward said depression when said film is disposed between said major surfaces; said terminations of said film circuits having predetermined locations conforming to the predetermined locations of such electrical leads on said semiconductor circuit; said self-supporting film and said metallic film circuits thereon having an extent to project beyond the extremities of said base and said cover members whereby electrical contact may be made to said film circuits and to such electrical leads of a semiconductor circuit disposed in said depression; and resilient means disposed in said recess for urging said metallic film circuits against said electrical leads.

In carrying out the invention according to one form a carrier for a semiconductor circuit as indicated is provided wherein said resilient means comprises a soft rubber member having a central aperture of essentially the same lateral dimensions as the body portion of such semiconductor circuit, one of said base and cover members includes locating means for determining the orientation of the leads of a semiconductor circuit disposed in said depression.

Other objects and advantages will become clear as the description proceeds.

DESCRIPTION OF THE PREFERRED EMBODIMENT

Figure 1:
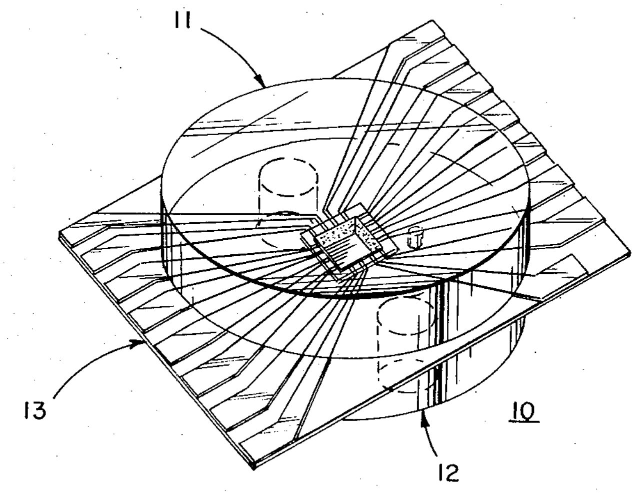
FIG. 1 is a prospective view of an integrated circuit carrier according to the invention.
Figure 2:
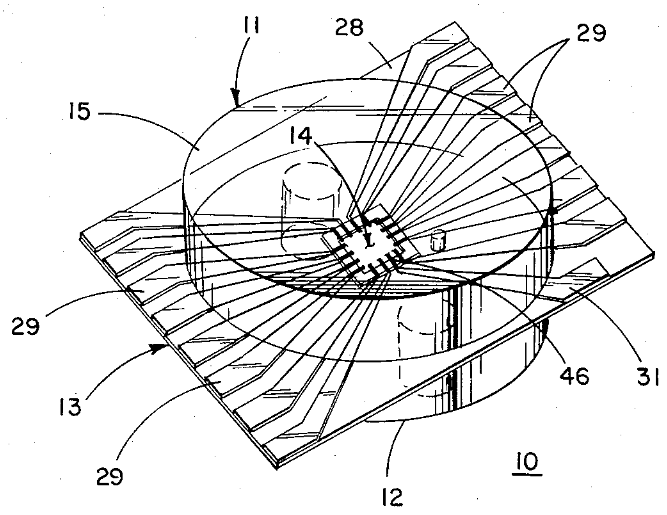
FIG. 2 is a prospective view of the carrier shown in FIG. 1 with an additional component included.

Referring to the drawings a carrier 10, according to the invention, is shown as comprising a base member 11, a cover member 12 and a circuit fan-out 13 all assembled as shown in FIGS. 1 and 2. The base member 11 and cover 12 are made of optically clear materials, having high dimensional stability at elevated temperatures such as 150°C, high electrical resistance, and high impact resistances. Synthetic substances of the polyolefin family, for example, have been found to have the desired properties.

When assembled the base member 11 and the cover 12 are held together as will be described and the circuit fan-out 13 is held in proper location in between, the metallic circuits on the fan-out 13 engaging appropriate beam leads on a beam lead integrated circuit 14 as may be seen in FIG. 2.

The base member 11 comprises a base 15 which is relatively massive, a pair of upwardly projecting studs 16 and 17 which may be integrally case or formed with base 15 and a depression 18 formed essentially centrally of the base 15. In addition, a locating hole 19 may be formed inwardly from the major surface 21 of the base 15 for a purpose that will become clear.

Figure 3:
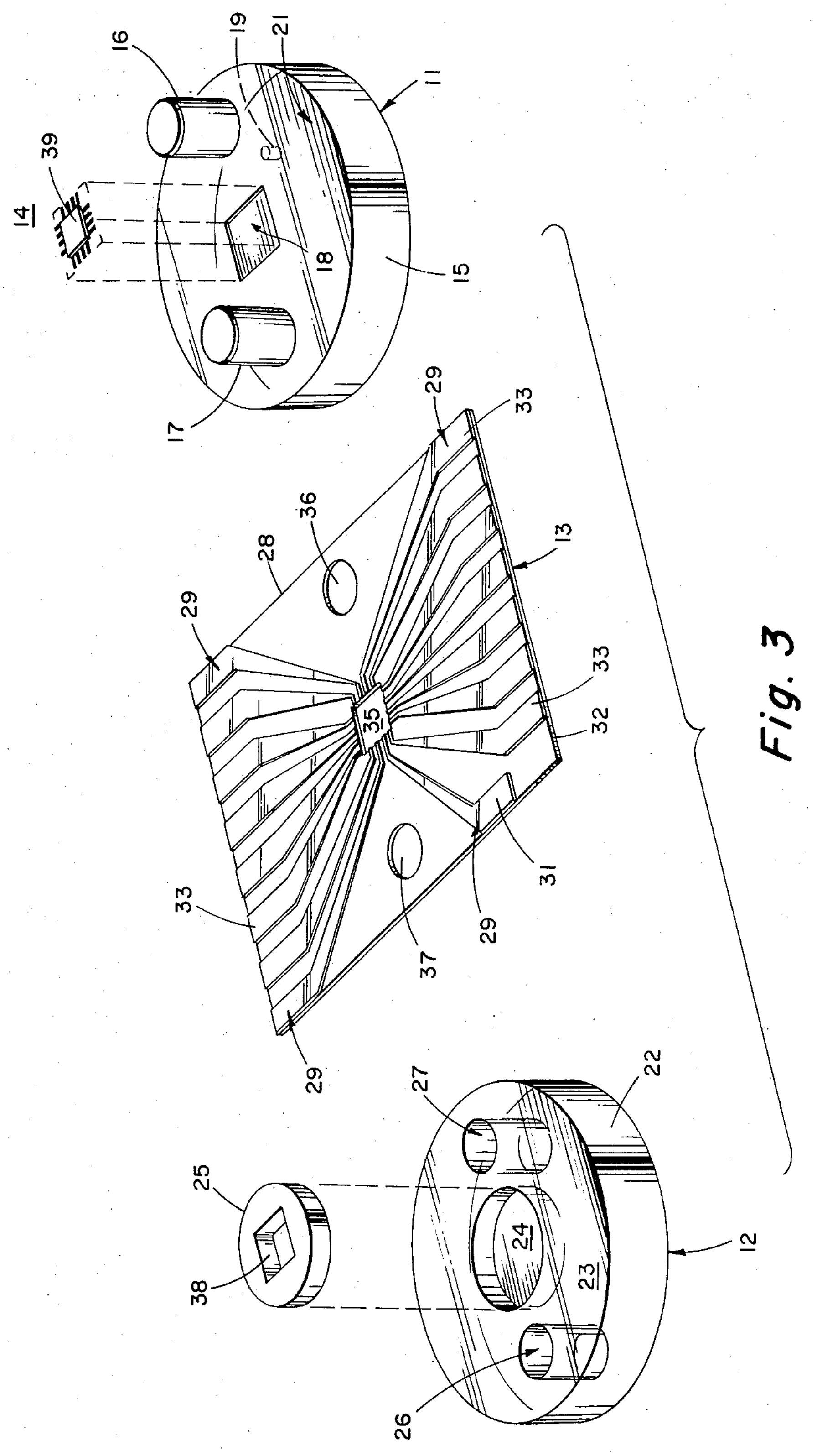
FIG. 3 is an exploded prospective view of the components shown in the preceding figures.

In the right hand portion of FIG. 3 the beam lead integrated circuit 14 is shown above the depression 18 into which it is to be received as will be more fully described. The base member 11 in FIG. 3 is shown right side up as compared with the position of this member in FIGS. 1 and 2 in order that, in the latter figures, the beam lead integrated circuit 14 may be seen directly without the need for dotted lines. The cover member 12 comprises a cover 22 including a major surface 23. Extending inwardly into cover 22 from the major surface 23, substantially centrally thereof, is a hole, or recess, 24 into which a soft rubber pressure pad 25 is disposed as may be seen in the left hand portion of FIG. 3. Extending all the way through the cover 22 are a pair of holes 26 and 27 of the same diameter essentially, although slightly smaller, as the studs 16 and 17 of the base member 11. To assemble the carrier, the cover member 12 with the soft rubber piece 25 in the recess 24 is rotated 180 degrees in effect so that the hole 27 is received over the stud 17 and the hole 26 is received over the stud 16.

The fan-out circuit 13 is a precision component made, for example, of a film material available commercially under the name KAPTON and, for example, may be of the order of 0.001 inch thick. The film base 28 of the fan-out circuit has a series of metallic film circuits 29 formed thereon as shown. One of the metallic film circuits has an end 31 which terminates short of the edge 32 of the film base 28 in order that the fan-out circuit 13 can be appropriately oriented with respect to the beam lead circuit to be carried and tested as will become clear. Each of the metallic film circuits 29 has a contact portion 33 (including 31) and an inner contact terminal 34, 34A which terminate immediately adjacent the edge of a hole 35, the latter being substantially centrally of the fan-out circuit 13.

The metallic film circuits 29 are sometimes known as printed wires since no components are included thereon and may be, for example, a thin film of gold deposited on the surface of the film 28 by any of the well known techniques. Holes 36 and 37 are formed adjacent the respective sides of the film 28, the location of the holes 36 and 37 corresponding to the location of the studs 17 and 16, respectively, in the assembled structure. To assemble the fan-out circuit 13 to the base member 11 the fan-out circuit is in effect rotated 180°, side to side, so that the hole 36 is received over the stud 17 and the hole 37 is received over the stud 16. The diameter of holes 36 and 37 is such that the holes are just easily, but accurately receivable over the studs 17 and 16, respectively.

The soft rubber, for example, pressure pad 25 has a central hole 38 which is of the same dimensions, essentially, as the hole 35 in the center of fan-out circuit 13, and both of the holes are just slightly larger than the dimensions of the body portion 39 of the beam lead integrated circuit 14.

Figure 4:
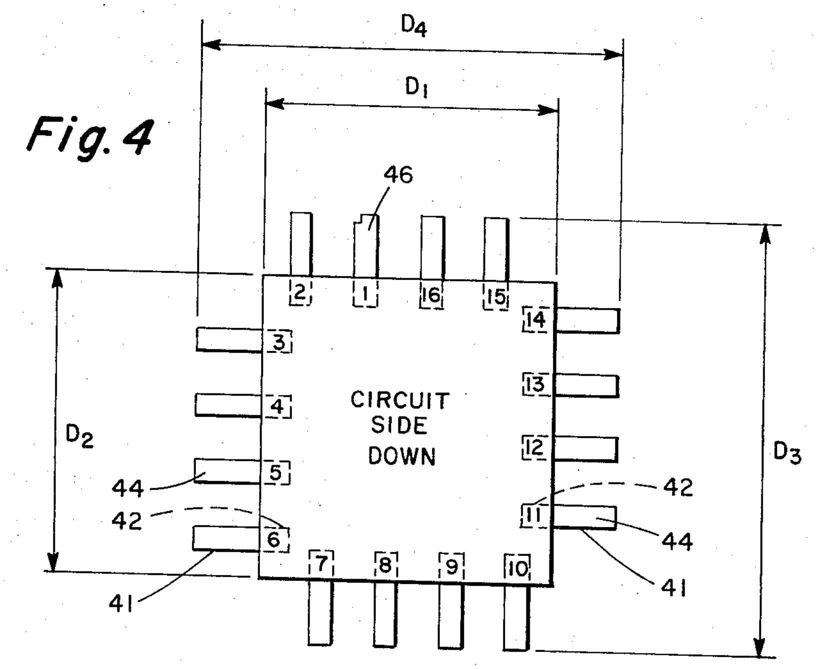
FIG. 4 is a plan view of a typical beam lead integrated circuit with which the invention is useable.
Figure 5:
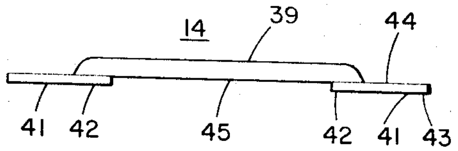
FIG. 5 is an elevational view of the circuit shown in FIG. 4.

Referring to FIG. 5, the beam lead integrated circuit 14 comprises the body portion 39 and the beam leads 41 extending outwardly on all sides therefrom as shown. The body portion 39 comprises a supporting substrate and the integrated circuit proper as will be understood, and need not be described here. In FIG. 4, the integrated circuit is shown with the circuit side down. The beam leads 41 have inner ends 42 which are bonded to the integrated circuit in the body 39 as is well understood. Of the beam leads 41 it is also understood that the surface 43 is the surface to which exterior conductors or other leads are subsequently bonded such as by welding or soldering. The rear faces 44 of the beam leads 41 are not utilized for this purpose and are shown facing upwardly in FIG. 4. In the manufacture of beam lead integrated circuits the dimensions $D_1$ and $D_2$ are controlled but not as accurately as some others. And while $D_1$ and $D_2$ are shown essentially equal this need not be the case. The overall dimensions, or projections, $D_3$ and $D_4$ of the beam leads however are very accurately controlled. Accordingly the dimensions $D_3$ and $D_4$ which may or may not be equal are useable to orient the beam lead circuit for mounting in the carrier and for subsequent testing as will be described.

The surface 45 of the body 39 of the integrated circuit may be referred to as the surface in which the integrated circuit exists.

Referring to FIG. 4 the beam lead 46 is shown as having a small notch in one end and conforms to terminal number 1 of the beam lead circuit. Position No. 1 is the second one in from the left in FIG. 4. This is arbitrary since the numbering of the circuits can follow any convention or pattern. However in order to orient the beam lead circuit properly in the carrier for testing purposes, the beam lead 46 is identified and is oriented so that when the beam lead circuit is placed with the beam leads 41 in the depression 18, the beam lead 46 (terminal No. 1) falls in the quadrant identified by the hole 19 in the major surface 21 of the base 15. Likewise the metallic film circuit 29 having the terminal portion 31 and the inner terminal portion 34A is also the second metallic film circuit in from one corner of the fan-out circuit 13. The fan-out circuit 13 is thus constructed such that the metallic film circuit including the terminal 31 falls in the same quadrant as the beam lead 46. Consequently the inner terminal 34A of the film circuit 29 comes into contact with the undersurface of the beam lead 46.

Figure 6:
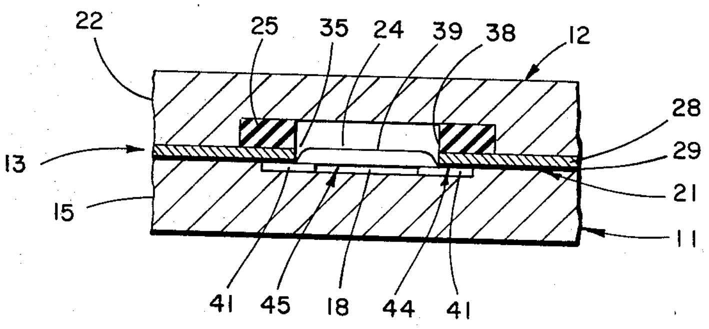
FIG. 6 is a fragmentary sectional view on a different scale of an assembled carrier with a beam lead integrated circuit mounted therein.

Referring more particularly to FIG. 6, it will be seen that the beam lead circuit 39 is disposed in the depression 18 so that the overall extent, or projection, of the beam leads 41 is accurately received within the edges of depression 18. The beam lead circuit is therefore accurately positioned or located for subsequent testing. This may also be visualized by the right hand portion of FIG. 3 and FIG. 2. The depth of the depression 18 is such that the undersurfaces 44 of the beam leads in effect coincide with the major surface 21 of the base member 11. The metallic film circuits terminals 34, 34A directly overlie the back surfaces 44 of the beam leads 41. This occurs because the dimensions of the hole 35 in the fan-out circuit member 13 is essentially the same size but perhaps very slightly larger than the body portion 39 of the beam lead integrated circuit.

The hole 38 in the soft rubber pressure member 25 is of the same size as hole 35 as indicated and, thus, as seen in FIG. 6, conforms to the opening 35 in the fan-out circuit member 13. Accordingly the soft rubber member 25 which is slightly thicker than the depth of the recess 24 exerts slight pressure against the inner edges of the hole 35 of the fan-out circuit 13. It, thus, forces the contacts 34, 34A of the metallic contact strips 29 into contact with the back surfaces 44 of the beam leads 41. Hence the integrated circuit surface 45 is free of any contact with the surface of the depression 18 and remains free of any contamination from this source. Ordinarily, the integrated circuit surfaces are passivated and not exposed in any event. The surfaces 43 of the beam leads 41 to which ultimate contact will be made, when the beam lead circuit is installed, is disposed against the bottom of the depression 18 and thus is free of any contact with metal and remains free of any contamination.

The depth of the recess 24 as may be seen in FIG. 6 is substantially greater than the thickness of the integrated circuit member so that no interference or contact with the beam lead integrated circuit occurs from this source. The recess 24 is only a recess and does not extend all the way through the cover 22. Similarly, the depression 18 does not extend all the way through the base 15. Thus when the base 15 and the cover 22 are pressed together, the beam lead circuit is, in effect, isolated from the outside world.

Referring to FIGS. 1, 2 and 3 it will be visualized that when the beam lead circuit is disposed in the carrier as has been described and the cover 22 is pressed onto the base 15 the cover 22 is held relatively tightly to the base 15 by the frictional engagement between the studs 16 and 17 and the holes 26 and 27 which may be sized so as to produce the necessary friction.

The soft rubber member 25 or similar material included in the designation, in addition to urging the metal film strips 29 into contact with the beam leads, produces a light seal from the outside of the cavity in which the beam lead circuit is mounted.

Referring to FIG. 2 where the integrated circuit surface 45 is uppermost it will be visualized that this surface is visible through the optically clear material of the base 15 of base member 11. Through the flat side of base 15, the integrated circuit can be examined by use of a magnifying glass or microscope to determine that the circuit is intact to the extent that it could be inspected without being mounted in the carrier. This may also be visualized of course in FIG. 6 by noting that one is looking through from the bottom of the figure. Similarly, comparing FIG. 2 and FIG. 6 it can be seen that the beam leads are in engagement with the ends 34, 34A of the appropriate metallic film strips because the beams will overlie the ends on the metallic film strips. If for any reason it is necessary to examine the rear side or substrate side of the body portion 39 this of course can be done, as may be visualized in FIG. 6, by viewing the structure from the top side down, that is through the cover 22.

We claim:

1. A removable carrier for a semiconductor circuit having a body portion and relatively rigid electrical leads extending therefrom at predetermined locations comprising:

an electrically-insulating base member having a major surface;

said base member including a central depression in said major surface thereof, said depression having dimensions to accurately accommodate such semiconductor circuit and such electrical leads extending therefrom and said leads being adapted to have predetermined positions relative to the edges of said depression;

an electrically-insulating cover member having a major surface for disposition in face to face relationship with the major surface of said base member, said cover member including a central recess extending inwardly from said major surface of said cover member;

means for removably holding said base member and said cover member in an assembled condition and when so held, said central recess registers with said central depression;

a self-supporting, electrically-insulating thin film having metallic film circuits disposed thereon for disposition between said major surfaces of said base and said cover members;

said self-supporting film having means for removably holding the same in a predetermined position when said film is disposed between said base and said cover member for holding said metallic film circuits in predetermined locations;

a central opening in said self-supporting film adapted to register with said depression when said film is held in its predetermined position;

said metallic film circuits terminating at the edges of said central opening in said self-supporting film and being disposed toward said depression when said film is disposed between said major surfaces;

said terminations of said film circuits having predetermined locations conforming to the predetermined locations of such electrical leads on said semiconductor circuit;

said self-supporting film and said metallic film circuits thereon having an extent to project beyond the extremities of said base and said cover members whereby electrical contact may be made to said film circuits and to such electrical leads of a semiconductor circuit disposed in said depression; and resilient means disposed in said recess for urging said metallic film circuits against said electrical leads.

2. A removable carrier for a semiconductor circuit according to claim 1 wherein said base member and said cover member are transparent.

3. A removable carrier for a semiconductor circuit having a body portion and relatively rigid electrical leads extending therefrom at predetermined locations comprising:

a transparent, electrically-insulating base member having a major surface;

said base member including a central depression in said major surface thereof, said depression having dimensions to accurately accommodate such semiconductor circuit and such electrical leads extending therefrom and said leads being adapted to have predetermined positions relative to the edges of said depression;

guiding and holding members extending upwardly from said major surface;

a transparent electrically-insulating cover member having a major surface for disposition in face to face relationship with the major surface of said base member, said cover member including a central recess extending inwardly from said major surface of said cover member;

holes in said cover member adapted to be disposed over said guiding and holding means for removably holding said cover member to said base member and when so disposed, said central recess registers with said central depression;

a self-supporting, electrically-insulating thin film having metallic film circuits disposed thereon for disposition between said major surfaces of said base and said cover members;

said self-supporting film having openings therein to be disposed over said guiding and holding members when said film is disposed between said base and said cover members for removably holding said metallic film circuits in predetermined locations;

a central opening in said self-supporting film adapted to register with said depression when the openings of said film are disposed over said guiding and holding means;

said metallic film circuits terminating at the edges of said central opening in said self-supporting film and being disposed toward said depression when said film is disposed between said major surfaces;

said terminations of said film circuits having predetermined locations conforming to the predetermined locations of such electrical leads on said semiconductor circuit;

said self-supporting film and said metallic film circuits thereon having an extent to project beyond the extremities of said base and said cover members whereby electrical contact may be made to said film circuits and to such electrical leads of a semiconductor circuit disposed in said depression; and resilient means disposed in said recess for urging said metallic film circuits against said electrical leads.

4. A removable carrier for a semiconductor circuit according to claim 3 wherein said resilient means comprises a soft rubber member.

5. A removable carrier for a semiconductor circuit according to claim 3 wherein there is provided in one of said base and cover members locating means for determining the orientation of the leads of a semiconductor circuit disposed in said depression.

6. A removable carrier for a semiconductor circuit according to claim 5 wherein the locating means comprises a hole in said base member.

7. A removable carrier for a semiconductor circuit having a body portion of predetermined dimensions and relatively thick rigid electrical leads of accurate lineal projection extending upwardly and outwardly from such body portion at predetermined locations comprising:

an electrically-insulating base member having a major surface;

said base member including a central depression in said major surface thereof, said depression having lateral dimensions to accurately accommodate the lineal projection of such electrical leads and a depth dimension essentially equal to the thickness of such electrical leads to such semiconductor circuit, and said leads being adapted to have predetermined positions relative to the edges of said depression;

an electrically-insulating cover member having a major surface for disposition in face to face relationship with the major surface of said base member, said cover member including a central recess extending inwardly from said major surface of said cover member, and said central recess having lateral dimensions substantially greater than the lateral dimensions of the body portion of such semiconductor circuit and a depth dimension substantially greater than the thickness of such semiconductor circuit;

means for removably holding said base member and said cover member in an assembled condition and when so held, said central recess registers with said central depression;

a self-supporting, electrically-insulating thin film having metallic film circuits disposed thereon for disposition between said major surfaces of said base and said cover members;

said self-supporting film having means for removably holding the same in a predetermined position when said film is disposed between said base and said cover members for holding said metallic film circuits in predetermined locations;

a central opening accurately conforming to the lateral dimensions of the body portion of such semiconductor circuit in said self-supporting film adapted to register with said depression when said film is held in its predetermined position;

said metallic film circuits terminating at the edges of said central opening in said self-supporting film and being disposed toward said depression when said film is disposed between said major surfaces;

said terminations of said film circuits having predetermined locations conforming to the predetermined locations of such electrical leads on said semiconductor circuit;

said self-supporting film and said metallic film circuits thereon having an extent to project beyond the extremities of said base and said cover members whereby electrical contact may be made to said film circuits and to such electrical leads of a semiconductor circuit disposed in said depression; and
resilient means disposed in said recess for urging said metallic film circuits against said electrical leads.

8. A removable carrier for a semiconductor circuit according to claim 7 wherein said resilient means comprises a soft compliant member having a central aperture of essentially the same lateral dimension as the body portion of such semiconductor circuit.

9. A removable carrier for a semiconductor circuit according to claim 8 wherein said base and cover members are of transparent material.

10. A removable carrier for a semiconductor circuit according to claim 9 wherein there is provided in one of said base and cover members locating means for determining the orientation of the leads of a semiconductor circuit disposed in said depression.

11. A removable carrier for a semiconductor circuit according to claim 10 wherein the locating means comprises a hole in said base member.

12. A removable carrier for a semiconductor circuit according to claim 7 wherein said holding means for said base and cover members comprises:
guiding and holding members extending upwardly from the major surface of said base member; and
holes in said cover member adapted to be disposed over said guiding and holding means.

13. A removable carrier for a semiconductor circuit according to claim 10 wherein the metallic film circuits on said self-supporting film include an indicia associated with one of said metallic film circuits for orienting same with respect to said locating means.

14. A removable carrier for a semiconductor circuit according to claim 13 wherein said indicia comprises a shortened end on one of said metallic film strips.

15. A removable carrier for a semiconductor circuit according to claim 7 wherein said semiconductor circuit comprises an integrated circuit on a substrate and said relatively rigid leads comprise beam leads.

* * * * *